United States Patent [19]

Gordon et al.

[11] Patent Number: 5,526,974
[45] Date of Patent: Jun. 18, 1996

[54] FINE PITCH ELECTRONIC COMPONENT PLACEMENT METHOD AND APPARATUS

[76] Inventors: Thomas Gordon, 12044 Rue Des Amis, San Diego, Calif. 92131; Douglas Farlow, 11873 Calle Parral, San Diego, Calif. 92128

[21] Appl. No.: 370,631

[22] Filed: Jan. 10, 1995

[51] Int. Cl.$^6$ ........................................................ H05K 3/34
[52] U.S. Cl. ........................... 228/103; 228/49.5; 228/6.2
[58] Field of Search ..................... 228/103–105, 228/180.21, 248.1, 6.2, 49.5; 29/834, 836, 340

[56] References Cited

U.S. PATENT DOCUMENTS

| | | | |
|---|---|---|---|
| 3,574,934 | 4/1971 | De Rose | 228/260 |
| 3,831,250 | 8/1974 | Holiday | 228/180.1 |
| 4,512,509 | 4/1985 | Ellis, Jr. et al. | 228/234.2 |
| 4,595,794 | 6/1986 | Wasserman | 228/49.5 |
| 4,985,107 | 1/1991 | Conroy et al. | 228/6.2 |

Primary Examiner—Samuel M. Heinrich
Attorney, Agent, or Firm—John R. Duncan; Frank D. Gilliam

[57] ABSTRACT

A method and kit for precisely placing fine pitch surface-mount electronic components onto printed circuit boards. An alignment substrate having a pattern of solder pads and holes or transverse edges corresponding to the pattern of solder pads and holes or edges on a printed circuit board is secured to a base by registration pins fastened to the base and inserted into contact with said holes or edges. Generally, the alignment substrate is preferably another circuit board identical with the board to be bonded to the electrical component. A template having a pattern of recesses corresponding to the component lead pattern is secured over the alignment substrate. A component is placed on the template with leads in the recesses. The component is lifted away, a printed circuit board is placed over the template and the component is lower onto the board. The board with component in place can then be removed for soldering.

15 Claims, 2 Drawing Sheets

5,526,974

FINE PITCH ELECTRONIC COMPONENT PLACEMENT METHOD AND APPARATUS

BACKGROUND OF THE INVENTION

This invention relates in general to the placement of electronic components on printed circuit boards and, more specifically to a method for very precisely placing high pin count, fine pitch, components on a circuit board for soldering thereto.

Originally, printed circuit boards included plated holes into which leads of electronic components were inserted and soldered. Currently, circuit boards tend to have closely spaced surface pads with the component simply placed on the board with leads in contact with the pads, to which the leads are then soldered.

The pattern of closely spaced wires and pads for connection to component leads are usually formed on the printed circuit board base by silkscreening techniques. After board fabrication and during assembly operations, a stencil having through holes conforming to the pad pattern is placed over the pad array and precisely aligned therewith. A solder paste made up of very small solder balls in a slurry of flux and other ingredients is wiped over the stencil with a squeegee, forcing small amounts of paste through the holes onto the pads. The stencil is lifted away leaving the paste on the pads. The components must then be very precisely placed on the board with the component leads aligned with the pads. Accuracies on the order of 0.0005 inch are often required. Once the component is placed, the solder is melted, generally in an infrared or convection oven, and bonds between the pad and lead.

Very large, very expensive, robotic machines have been developed for accurately placing components on such surface mount boards with leads precisely aligned and soldering the leads to the pads in very high volume manufacturing operations. These machines make use of extremely expensive vision alignment equipment and other optical devices to precisely locate the components. These large and complex machines require considerable operator training and the component and board designs cannot be rapidly and easily changed. Exemplary of such machines is that described by Takahashi et al. in U.S. Pat. No. 4,292,116. Such large devices are not economically feasible, or well adapted to, low to medium volume operations where only a few fine pitch parts are placed on relatively few boards.

Attempts have been made to develop flexible, rapidly adaptable, devices that can be set up to accurately place different surface mount components on varying boards. Two basic methods are used to perform the component to pad pattern orientation, the "tooling pin" method and the "pad location" method.

The tooling pin method takes advantage of tooling holes formed in the board. The tooling holes are precisely oriented relative to the pad pattern. A stencil is formed with openings conforming to the pad pattern along with tooling holes and oriented relative to the tooling pins in the same position as the printed circuit board. Registration pins are placed in the tooling holes and a component is placed with leads extending through the pad pattern openings. The component is then lifted vertically and a "printed" board (that is, a board with solder paste on the pads) is placed on registration pins with the component then lowered vertically, placing the leads back onto the printed pads. The solder paste is then heated to solder the leads to the pads.

While effective where great precision is not required, this method suffers from excessive tooling hole tolerances. Typically, tooling holes have and "X" and "Y" tolerances of about 0.005 inch, with a true position radius tolerance of about 0.007 inch. The resulting error is unacceptable with any component with leads below a 0.020 inch distance or "pitch" between two adjacent leads. The resulting error is unacceptable with any component with leads below a 0.020 inch distance or "pitch" between two adjacent leads. Printed circuit boards manufactured in the same production "lot" can easily achieve tolerances of about 0.005 inch with a true position radius of about 0.0007 inch. Since the tooling holes in the stencil are fixed, it cannot take advantage of the variations in tooling hole locations on a given lot of boards. Typical of devices using an index pin and hole orientation technique are those described by Wasserman in U.S. Pat. No. 4,595,794 and by Conroy in U.S. Pat. No. 4,985,107.

Others have attempted to use an orientation fixture engaging the corners or edges of the component to align the component leads with the board pads. Typical of these is the device described by Read in U.S. Pat. No. 4,722,135. Since the tolerance of corners and edges are generally not sufficiently tight, complex measuring and adjustable alignment mechanisms are generally required.

Thus, there is a continuing need for methods of placing fine pitch surface-mount electronic components onto printed surface with very high accuracy with simple equipment requiring limited training of operators and capable of rapidly changing to different boards and components for short production run work.

SUMMARY OF THE INVENTION

The above noted problems, and others, are overcome by a method of precisely placing fine pitch surface-mount components on printed circuit boards (the "pad location" method) which basically begins with providing an alignment substrate having a conventional pattern of pads to which component leads are to be soldered. The alignment substrate pad pattern precisely matches the solder pad pattern on the circuit boards to which components are to be soldered. The alignment substrate also has holes or edges (collectively constituting transverse surfaces) corresponding to transverse surfaces such as holes or edges on the printed circuit board upon which the components are to be place. The alignment substrate has the required tolerances and is essentially identical with the boards upon which components are to be placed, by using a sample from the production run that produced the boards to be used. The pattern of pads and transverse surfaces on the substrate and the pattern of solder pads and transverse surfaces on the selected printed circuit board are geometrically substantially identical. For optimum performance, the substrate is one of the printed circuit boards from the same lot as the printed circuit boards upon which components are to be mounted using the method and apparatus of this invention.

Registration pins, preferably mounted on a thin foil mounting strip, are placed into the alignment substrate holes (two minimum) or against substrate edges (three edges minimum) and the pins are secured to base, such as a smooth surfaced granite block. Preferably, the pins are secured to the base by means of tape placed over a mounting strip and the base adjacent to the strip, since it does not leave a residue when peeled from the base.

Orientation templates having an array of recesses corresponding to the pattern of solder pads on the alignment substrate is then placed on the alignment substrate with the recesses aligned with the pads. While any suitable alignment method may be used, preferably at least two of the recesses extend entirely through the template. For best results, two through hole recesses are provided at each corner of a rectangular recess pattern. The template can be easily and accurately adjusted by simply looking through the through holes and observing the pad alignment. The orientation template is then taped down to the substrate and becomes the orientation fixture.

The non-through recesses are preferably fairly shallow, since leads placed in deep recesses may snag on recess walls and bend the leads or move the component out of position when lifted vertically. For best results, recesses having depths of from about ¼ to ½ the thickness of the component leads are preferred.

A selected electronic component having an array of leads matching the template recesses is then placed on the template with the leads in the recesses.

The component is then lifted away along a line generally perpendicular to the base and template surfaces. Any suitable mechanism may be used for lifting and holding the component. Preferably, a tube is brought into contact with the upper component surface (typically having a compliant rubber seal or nozzle around the tube end, the tube is evacuated to a predetermined vacuum, and the tube is lifted, carrying the component with this. An excellent device for precisely lifting and lowering a component as necessary is available from XY Technologies, San Diego, Calif. under the "First Placer" trademark.

Once the component is lifted, a printed circuit board is placed over the alignment substrate, with the alignment pins extending through the alignment substrate holes or against the substrate edges and into the printed circuit board holes or against the circuit board holes.

The component is then lowered onto the printed circuit board, with the component leads automatically precisely located on the solder pads.

The leads are then soldered to the pads in any suitable manner. Typically, solder paste could be applied to the pads prior to placing the printed circuit board on the alignment substrate and the solder can be heated by convection heating or the like. Additional components can be soldered to additional printed circuit boards without changing the alignment substrate set-up.

BRIEF DESCRIPTION OF THE DRAWING

Details of the invention, and of preferred embodiments thereof, will be further understood upon reference to the drawing, wherein.

DETAILED DESCRIPTION OF PREFERRED EMBODIMENTS

Figure 1:
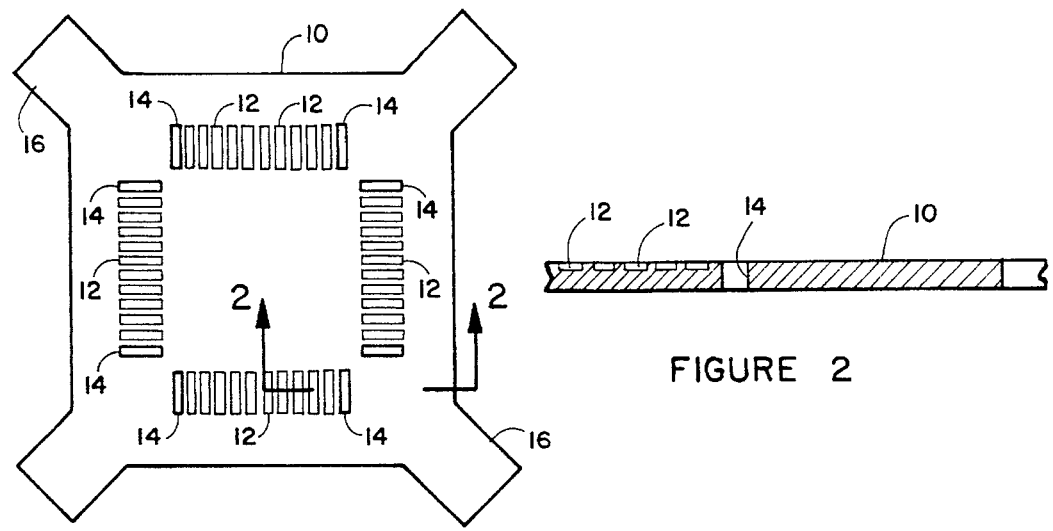
FIG. 1 is a plan view of an orientation template.
Figure 2:
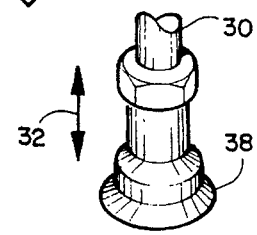
FIG. 2 is a section view taken on line 2—2 in FIG. 1.

Referring to FIGS. 1 and 2, there is seen a template 10 having a plurality of shallow recesses 12 and some through hole recesses 14. The recess pattern precisely matches the pattern of leads on a conventional fine pitch surface-mount electronic component. For best results, shallow recesses 12 have depths of from about ¼ to ½ of the thickness of the component leads. Preferably, the template has a thickness of from about 0.004 to 0.012 inch. The sides of deeper recesses may snag leads as the component is inserted and removed, bending the leads or moving the component out of position as it is lifted vertically.

While a template 10 could be aligned with a solder pad pattern (as detailed below) using any suitable method, the use of at least two through holes 14 is preferred so that solder pads can be seen through the holes for precise alignment. While any suitable number of through holes 14 may be used, from two to eight are preferred for maximum ease and accuracy of positioning.

Template 10 may have any suitable shape. A generally rectangular shape, with at least two corner tabs 16 is preferred since in most cases it is desirable to tape template 10 in place prior to component positioning. Tape can be conveniently placed across each tab 16 and extend over the underlying alignment substrate.

Figure 3:
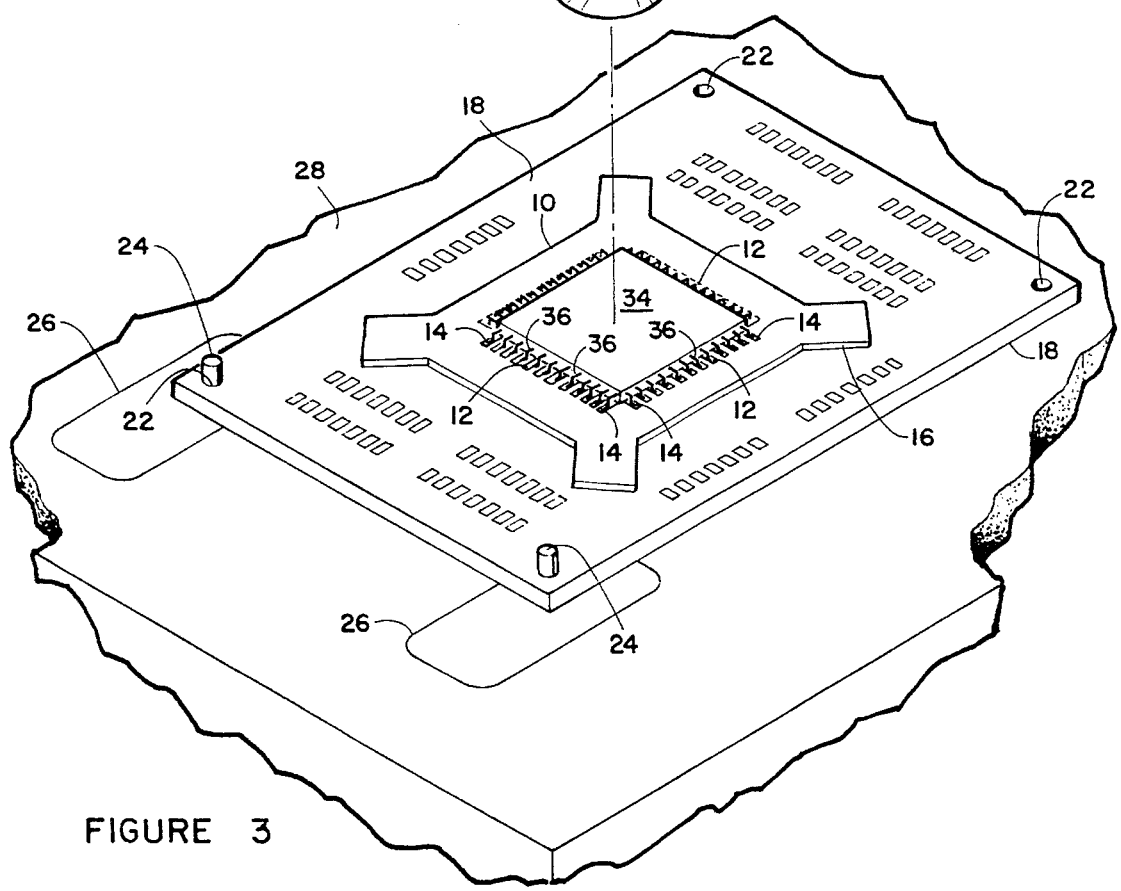
FIG. 3 is a perspective view showing an assembly of alignment substrate, registration pins, template and registration pins in place on a base.
Figure 4:
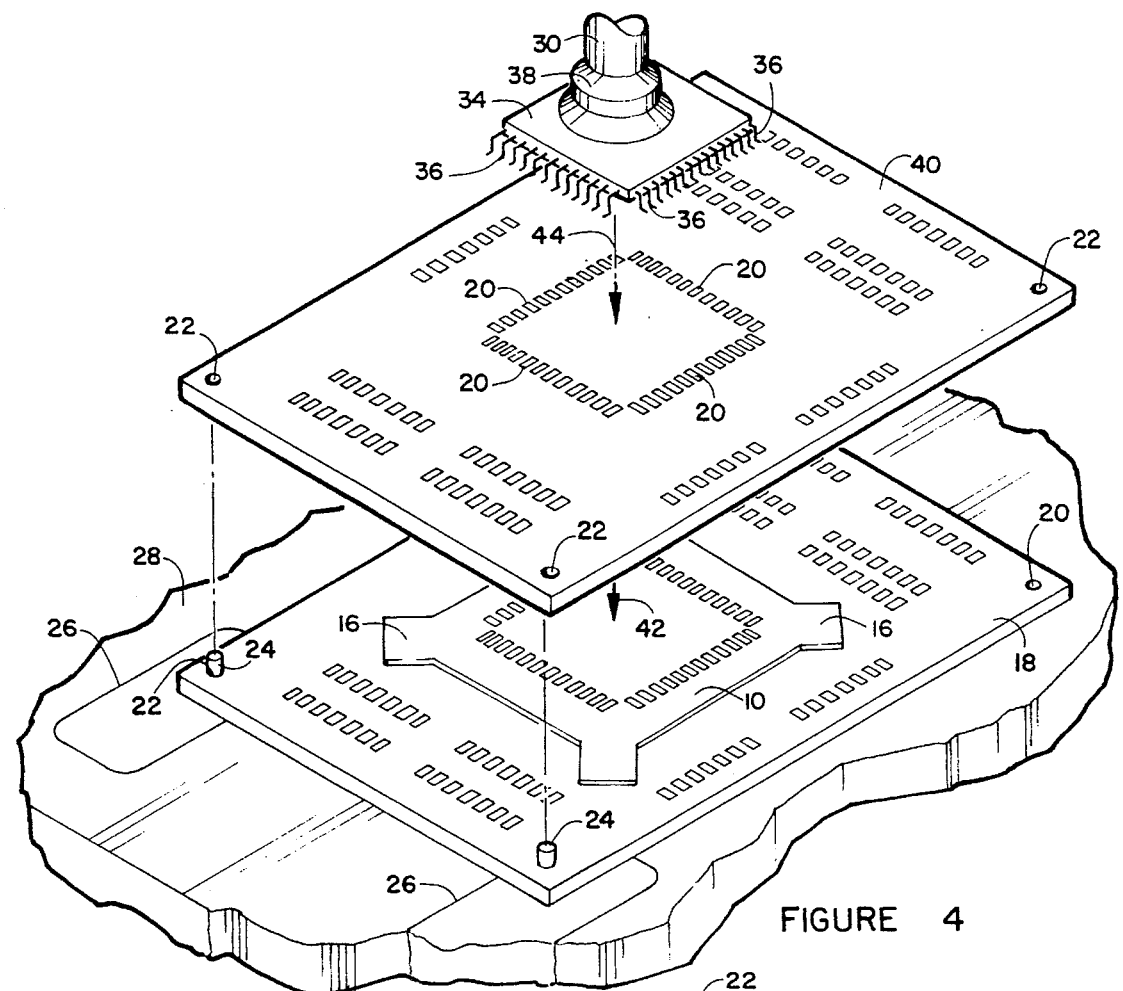
FIG. 4 is an exploded perspective view showing the addition of a printed circuit board.

The initial steps in precisely placing components on a circuit board are illustrated in FIG. 3. An alignment substrate 18 is provided having a pattern of solder pads 20 (as seen in FIG. 4) corresponding the lead positions of a conventional electronic component. While any such alignment substrate 18 may be used, for optimum accuracy in component placement, the alignment substrate should be an actual printed circuit board identical with the boards upon which components are to be placed. Optimally, alignment substrate 18 will be from the same manufacturing lot as the boards to be used, since registration hole, routed edges and solder pad tolerances are generally tighter within a lot than between boards from varying lots.

Several registration holes 22 are provided through alignment substrate 18, at the four corners in the embodiment illustrated. Registration pins 24 having diameters corresponding to the diameters of registration holes 22 are each mounted, such as by soldering, on a thin metal sheet 26, preferably having a thickness of from about 0.008 to 0.012 inch to have sufficient strength while not raising the overlying alignment substrate edge excessively. At least two registration pins 24 are placed through registration holes 22 (or at least three registration pins are placed against three edges and the assembly is placed on a base 28, preferably a very smooth granite surface, under a pickup head 30 of the sort provided in the First Placer placement device, movable up and down as indicated by arrow 32 along a line perpendicular to the surface of base 28. The sheets 26 are then releasably secured to base 28 by any suitable means, such as tape extending over sheets 26 and the adjacent base surface, pressure-sensitive adhesive coatings on the undersides of sheets 26, etc.

A template 10 is then placed over the solder pads and aligned therewith by the operator observing pads through holes 14. Since holes 14 and recesses 12 have dimensions substantially matching the dimensions of the solder pads on the alignment substrate 18, an operator can easily assure exact alignment. The template is then secured to the surface of alignment substrate 18, such as with pressure sensitive tape (not shown for clarity).

An electrical component 34 having a plurality of closely spaced surface-mount leads 36 is then placed in recesses 12. While the method and apparatus of this invention is particularly useful with "gull wing" leads of the sort shown, other lead configurations may be used, if desired. For example, ball grid arrays using small round balls spaced along the underside of a component may be used with round recesses 12, the recesses preferably having a diameter slightly less than the ball lead diameters.

An operator will inherently correctly place the components, since recesses 12 will capture the leads. Placing a component 34 directly on solder pads is very difficult and generally requires optical aids such as video cameras, microscopes, etc. While only a few leads 36 are shown along each side of component 34 for clarity of illustration, many components have a very large number, often exceeding 70 leads per side, with an adjacent center-to-center lead pitch of less than 0.02 inch.

Once a component 34 is placed, pickup head 30, having a soft rubber tubular nozzle 38 at the end, is lowered until the nozzle presses against the upper surface of component 34. Alternately, nozzle 34 could be a mechanically compliant, e.g. spring loaded, nozzle. The contact point need not be precisely centered on component 34. The interior of pickup head 30 is evacuated so that the resulting vacuum holds component 34 securely to nozzle 38. Pickup head 30 then is moved upwardly to lift component 34.

Template 10 is generally left in place (or removed if desired) and a printed circuit board 40 upon which component 34 is to be placed is placed directly on alignment substrate 18, as indicated by arrow 42 with registration pins 24 extending into registration holes 22 in board or against its edges. Solder paste (not seen) is placed on solder pads 20 by any conventional method prior to placing board 40 on registration pins 24.

Pickup head 30 is then lowered as indicated by arrow 44 until component 34 rests on the printed circuit board 40. The vacuum is released and nozzle 38 is lifted away.

Figure 5:
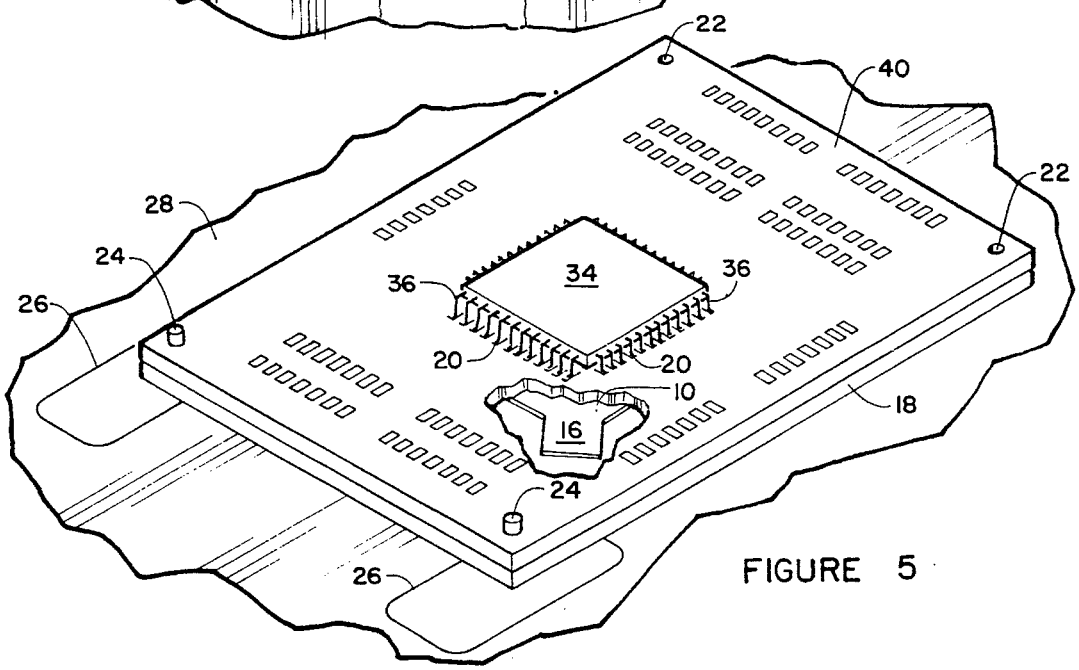
FIG. 5 is a perspective view showing final placement of a component on a printed circuit board.

FIG. 5 shows the completed placement. Component 34 is placed on board 40 with leads 36 precisely aligned with solder pads 20. Board 40 may be easily lifted off of registration pins 24 and moved to a conventional reflow station where the solder paste on solder pads 20 is heated to bond leads 36 to the pads. Template 10 is then replaced with a new component and the placement cycle can be immediately, rapidly and precisely repeated to place a component on another identical printed circuit board 40. When one sequence of boards is completed, alignment substrate 18 is removed from registration pins 24, the registration pin sheets 26 are removed and the entire sequence can be immediately begun for placement of a different component 34 on the same board or a different board 40.

While certain specific relationships, materials and other parameters have been detailed in the above description of preferred embodiments, those can be varied, where suitable, with similar results. For example, components having a ball grid array, column grid array, flip chips, etc. which have different contacts than the leads described above may be positioned by the method of this invention. Other applications, variations and ramifications of the present invention will occur to those skilled in the art upon reading the present disclosure. Those are intended to be included within the scope of this invention as defined in the appended claims.

We claim:

1. A method of precisely placing fine pitch surface-mount components onto printed circuit boards which comprises the steps of:

providing an alignment substrate having a pattern of pads on one substrate surface and at least two transverse surfaces;

said pattern of pads and transverse surfaces geometrically corresponding to a predetermined pattern of solder pads and transverse surfaces on a printed circuit board surface;

placing pins into contact with said substrate transverse surfaces;

placing said alignment substrate on a base;

securing said pins to said base;

placing a template having an exposed surface bearing an array of recesses corresponding to said solder pad pattern over said solder pads with said recesses in alignment with said solder pad pattern;

placing leads of a component in said template recesses;

lifting said component away from said template along a line substantially perpendicular to said exposed surface of said template;

placing said printed circuit board over said alignment substrate with said registration pins extending into contact with said printed circuit board transverse surfaces; and lowering said component along said line;

whereby said component leads are precisely aligned with said pattern of solder pads.

2. The method according to claim 1 wherein said transverse substrate surfaces are holes into which said pins are inserted.

3. The method according to claim 1 wherein said transverse substrate surfaces are at least three edges of said substrate and at least one pin is brought into contact with each of said surfaces.

4. The method according to claim 1 further including applying solder paste to said pattern of solder pads on said printed circuit board prior to lowering said component thereonto.

5. The method according to claim 1 wherein said alignment substrate is another printed circuit board which is substantially identical to said printed circuit board.

6. The method according to claim 1 wherein said lifting and lowering of said component is accomplished by bringing a tube into contact with said component, evacuating said tube to bind said component to said tube and lifting and lowering said tube and component.

7. The method according to claim 1 wherein said template has at least two through holes corresponding to at least two indicia on said substrate and said template is aligned with said pattern by observing said indicia through said holes and adjusting the position of said template.

8. The method according to claim 1 wherein said template has at least two through holes corresponding to at least two corresponding pads in said pattern of solder pads and said template is aligned with said pattern by observing said two pads through said holes and adjusting the position of said template.

9. The method according to claim 1 wherein said registrations pins are mounted on thin sheet material and are secured to said base by tape extending over said sheet material and adjacent base surface.

10. The method according to claim 1 wherein said recesses are formed to a depth of from about ¼ to ½ the width of said leads.

11. A kit for use in placing fine pitch surface-mount components onto printed circuit boards which comprises:

an alignment substrate having a pattern of pads on one substrate surface and having at least two transverse surfaces generally perpendicular to said substrate surface;

said substrate pad pattern and transverse surfaces geometrically corresponding to a predetermined printed circuit board pattern of solder pads and transverse surfaces;

registration pins sized to engage said substrate transverse surfaces and printed circuit board transverse surfaces;

means for securing said registration pins to a base;

a template for placement over and in alignment with said pattern, said template bearing an array of recesses corresponding to said pattern;

at least two holes extending entirely through said template to permit viewing of corresponding indicia on said substrate through said through recesses and for aligning said holes with said indicia;

said two holes geometrically aligned with said template recess substantially identically with geometric alignment of said indicia and said pads; and means for lifting said component away from said template along a line substantially perpendicular to said template exposed surface; and means for returning said component along substantially the same line after a printed circuit board is placed over said template.

12. The kit according to claim 11 wherein said transverse substrate surfaces are holes having a cross section substantially equal to cross sections of said pins.

13. The kit according to claim 11 wherein said transverse substrate surfaces are at least three edges of said substrate and at least one of said pins is positioned to engage each of said edges.

14. The kit according to claim 11 wherein said at least two holes correspond to at least two of said recesses so that a corresponding number of solder pads can be seen through said holes for alignment of said template.

15. The kit according to claim 11 wherein said substrate is a second printed circuit board substantially identical with said printed circuit board.

\* \* \* \* \*